Feb. 10, 1970 R. J. MELCHER 3,495,131

INTEGRATED CIRCUIT CONNECTOR ASSEMBLY

Filed July 16, 1968

INVENTOR.
ROBERT J. MELCHER
BY
Merchant & Gould
ATTORNEYS

United States Patent Office 3,495,131

Patented Feb. 10, 1970

3,495,131

INTEGRATED CIRCUIT CONNECTOR ASSEMBLY

Robert J. Melcher, Edina, Minn., assignor to National Connector Corporation, Minneapolis, Minn., a corporation of Minnesota Filed July 16, 1968, Ser. No. 745,193
Int. Cl. H02b *1/00*
U.S. Cl. 317—100 11 Claims

ABSTRACT OF THE DISCLOSURE

An assembly connects an integrated circuit member to a terminal board. Wire wrap pins extend from a bottom surface of the connector assembly for insertion through passages in the board. The connector pins from an integrated circuit member are inserted into receptacles in the upper surface of the connector assembly for engagement with the wire wrap pins. A metal heat sink member has a flat upper portion in contact with the integrated circuit member, a pair of side portions extending around the connector assembly, and a pair of end portions in intimate contact with the terminal board.

BACKGROUND OF THE INVENTION

Field of the invention

This invention relates generally to electrical connector assemblies, and more particularly relates to an assembly for connecting an integrated circuit member to a terminal board, which includes a heat sink member designed to dissipate the heat generated by the integrated circuit member.

Description of the prior art

In recent years, integrated circuits have been developed to the point where they are highly reliable. They have been successfully commercialized so that at the present time, many manufacturers of electronic equipment are using integrated circuits rather than discrete components. Typically, an integrated circuit is potted in a block of non-conductive material from which extend a plurality of metal conductor pins. An intermediate connector assembly is normally used to mount the integrated circuit member to a terminal board or chassis. The interconnection of the integrated circuit member with the other components of the system takes place at the terminal board.

Since an integrated circuit may contain many electrical components, including various semi-conductor devices, considerable heat is generated during operation of the circuit. This heat must be dissipated if the integrated circuit is to operate properly. Excessive heat can cause physical damage to the components of the integrated circuit and it can adversely affect the operating characteristics of the semi-conductor devices in the circuit. The system may thus fail completely or may operate in an erratic manner if the heat is not dissipated.

To avoid these problems, it is necessary to insure that the heat generated by the integrated circuit is dissipated quickly and continuously. In prior art systems employing integrated circuits, this cooling has been effected by permitting the free flow of air through the system or by using blowers to actually force the circulation of air through the system. Since one of the main advantages of integrated circuits is their small size, adding a blower to the system is undesirable in view of the relatively large amount of space required. If a blower is not used, the integrated circuits may have to be dispersed to some extent to permit heat dissipation to the atmosphere, thus increasing system size and again defeating one of the basic reasons for using integrated circuits.

SUMMARY OF THE INVENTION

The present invention provides a connector assembly for connecting an integrated circuit member to a terminal board, the connector assembly having a metal heat sink member as an integral part thereof. The heat sink member has a flat upper portion in contact with the integrated circuit member, a pair of side portions diverging therefrom and extending around the connector assembly, and a pair of end portions positioned in intimate contact with the terminal board. The heat sink member thus absorbs heat from the integrated circuit member and dissipates the heat both to the atmosphere and to the terminal board. The heat sink member of the present invention permits mounting the integrated circuits closer together and eliminates the need for circulating a large volume of air past the mounted integrated circuits.

DESCRIPTION OF THE PREFERRED EMBODIMENT

Figures 1, 2, 3, 4, 5:
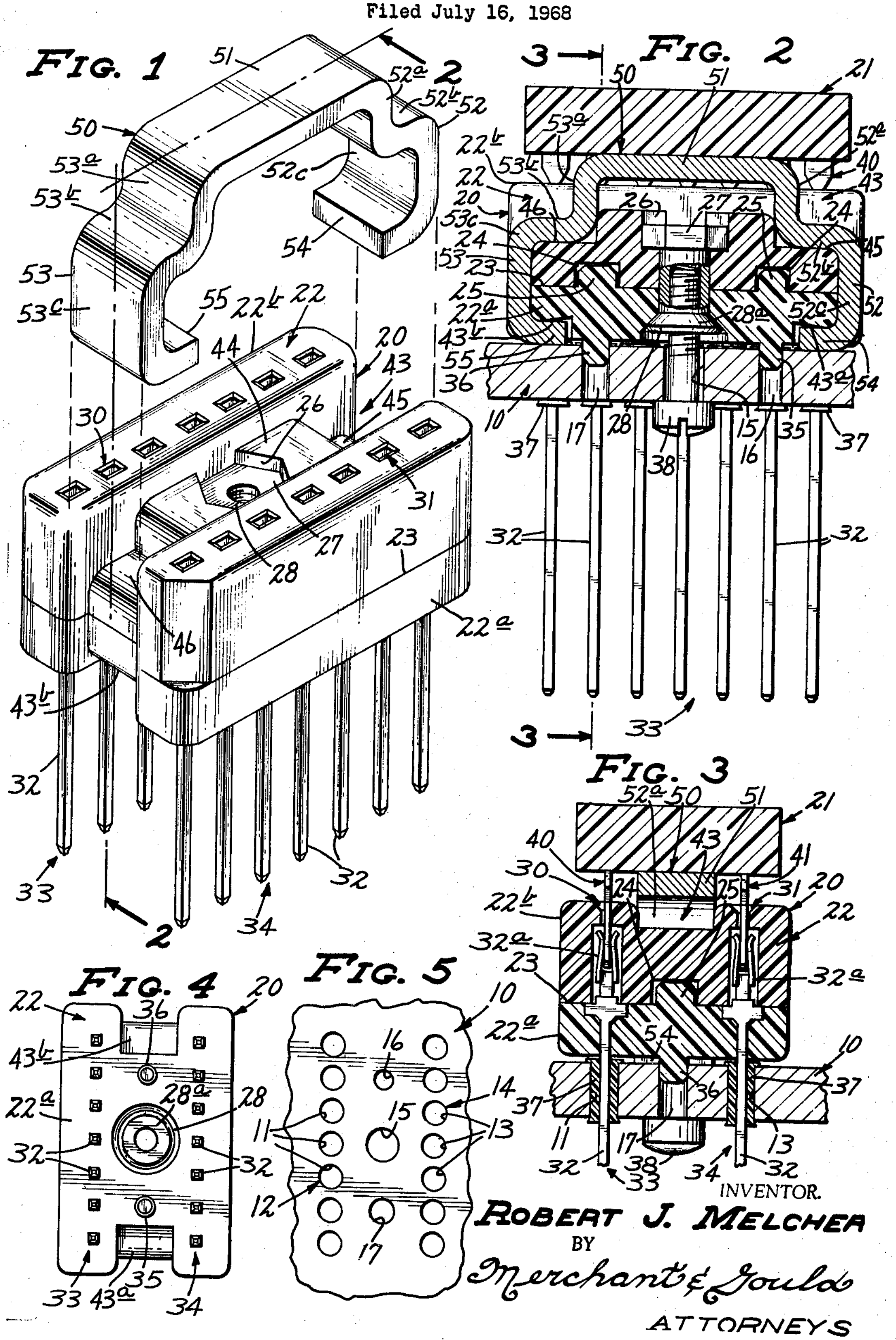
FIGURE 1 is an exploded view, in perspective, showing a connector assembly and heat sink member according to the present invention.
FIGURE 2 is a view in vertical section taken along line 2—2 of FIGURE 1, showing the heat sink member in an operative position with respect to the connector assembly and an associated integrated circuit member.
FIGURE 3 is a view in vertical section taken along line 3—3 of FIGURE 2, portions thereof being broken away.
FIGURE 4 is a bottom plan view of the connector assembly shown in FIGURE 1, on a slightly reduced scale.
FIGURE 5 is a fragmentary plan view of the terminal board shown in FIGURE 2.

Referring now to the drawings, wherein like numerals are used throughout the several views to indicate like elements of the invention, there is disclosed a metal terminal board 10, also called a "mother board" or chassis. Terminal board 10 is provided with a plurality of passages 11 forming a first row 12, and a like plurality of passages 13 forming a second row 14. In this particular embodiment, each of the rows 12 and 14 has seven passages. Rows 12 and 14 are parallel and spaced apart a predetermined distance. Formed centrally between the rows 12 and 14 is a single mounting opening 15. Also formed between rows 12 and 14 in terminal board 10 are a pair of indexing openings 16 and 17.

A connector assembly 20 is provided for connecting an integrated circuit member 21 to terminal board 10. Connector assembly 20 includes a connector body member 22 having a lower body portion **22*a* and an upper body portion 22*b*. Lower body portion 22*a* and upper body portion 22*b* are joined together generally along a plane designated by the numeral 23. The mating surfaces of portions 22*a* and 22*b* are provided with a pair of slots 24 and indexing tabs 25, each of the indexing tabs 25 extending into a corresponding slot 24 to position lower body portion 22*a* with respect to upper body portion 22*b***.

The upper surface of upper body portion **22*b* is provided with a hexagonal slot 26 into which a hexagonal upper head 27 of a hollow rivet 28 is inserted. Hollow rivet 28 has interior threads and a flanged lower head 28*a*. A suitable cavity is provided in the bottom surface of lower body portion 22*a* to accommodate flanged head 28*a*. When rivet 28 is placed in position and flanged head 28*a* is expanded as shown, body portions 22*a* and 22*b*** are securely drawn together.

Body member 22 is provided with two rows 30 and 31 of vertical openings that extend therethrough from the top surface to the bottom surface thereof. The openings within body member 22 are configured as shown in FIG. 3 to accommodate a plurality of wire wrap pins 32 each having a spring clip end portion **32*a* positioned within body member 22. A single wire wrap pin 32 is inserted in each opening in each of the rows 30 and 31 so that two spaced, parallel rows 33 and 34 of wire wrap pins are provided extending from the bottom surface of body member 22 in the same pattern as passages 11 and 13 in terminal board 10**.

Both portions **22*a* and 22*b* of connector assembly 20 are molded from a plastic material such as a phenolic material or from diallyl phthalate. Before the two body portions 22*a* and 22*b* are assembled together, the wire wrap pins 32 are inserted in their corresponding openings in lower body portion 22*a*, and then upper body portion 22*b* is placed over them. The two body portions are then locked together by means of rivet 28** as previously described.

The bottom surface of body member 22 is also provided with a pair of indexing tabs 35 and 36 that fit into the indexing openings 16 and 17 in board 10. Indexing openings 16 and 17 closely correspond in size to tabs 35 and 36 so that connector assembly 20 assumes a correct position on board 10, with the two rows of wire wrap pins 33 and 34 extending through corresponding passages 11 or 13 in rows 12 and 14. Where the board 10 is constructed from metal, each pin is provided with a plastic sleeve 37 that is positioned between the pin and the walls of the passage 11 or 13 through which it extends. Each pin 32 is thus insulated from terminal board 10.

To securely attach connector assembly 20 to board 10, a threaded screw 38 is inserted upwardly through opening 15 in board 10 for engagement with the interior threads of rivet 28, as best shown in FIG. 2.

Attached to the top surface of body member 22 is an integrated circuit member 21 having two spaced, parallel rows 40 and 41 of connector pins. The integrated circuit itself is not shown since it is normally potted within a suitable block fo non-conductive material from which extend the two rows 40 and 41 of connector pins. In this case, the two rows 40 and 41 of connector pins extend downwardly into the two corresponding rows 30 and 31 of openings in body member 22. The connector pins extend downwardly through the openings into engagement with spring clips **32*a* to provide an electrical connection between the integrated circuit and the wire wrap pins 32. As best shown in FIG. 2, each of the connector pins in rows 40 and 41 has a relatively wide upper portion extending from block 21 that narrows down to a smaller portion that engages the corresponding spring clip 32*a*. The wider upper portion of each of the connector pins in rows 40 and 41 thus engages the correspondingly shaped periphery of the corresponding opening in rows 30 and 31 to limit the downward movement of integrated circuit member 21 and leaving it spaced a predetermined distance from the upper surface of body member 22** as shown in FIG. 2.

Formed in the surface of body member 22 between rows 30 and 31 is a continuous open channel 43. Channel 43 is formed in the top surface of body member 22, in the two end surfaces thereof and extends into the bottom surface a predetermined distance from each end surface to form a pair of channel portions **43*a* and 43*b* terminating in a pair of channel ends adjacent tabs 35 and 36. The surface of continuous channel 43 is thus recessed with respect to the upper surface, the two end surfaces and the bottom surface of body member 22. The upper surface of channel 43 is divided into three sections, a horizontal center section 44 and two more deeply recessed horizontal end sections 45 and 46**.

Mounted in channel 43 is a metal heat sink member 50 having a flat upper portion 51, a pair of side portions 52 and 53 diverging therefrom and terminating in a pair of end portions 54 and 55. When mounted in channel 43, the flat upper portion 51 of heat sink member 50 extends above the upper surface of body member 22 and engages the bottom surface of integrated circuit member 21. Side portions 52 and 53 extend around the opposite end surfaces of body member 22 within channel 43 and the end portions 54 and 55 extend into channel portions **43*a* and 43*b* between body member 22 and terminal board 10**.

With the entire unit assembled as shown in FIG. 2, the flat upper portion 51 of heat sink member 50 lies in a generally horizontal plane and end portions 54 and 55 also lie in a horizontal plane parallel thereto. Each of the side portions 52 and 53 comprises an upper vertical leg portion **52*a*, 53*a*, a middle horizontal leg portion 52*b*, 53*b*, and a lower vertical leg portions 52*c*, 53*c*. The lower vertical leg portions 52*c* and 53*c* lie within the confines of channel 43 formed in the opposite end surfaces of body member 22. The middle horizontal leg portions 52*b* and 53*b* lie against the upwardly facing surfaces of end sections 45 and 46 of channel 43. The two upper vertical leg portions 52*a* and 53*a* extend upwardly therefrom to hold flat upper portion 51 above the surface of body member 22 against integrated circuit member 21**.

As best shown in FIG. 2, the minimum depth of channel portions **43*a* and 43*b* in the bottom surface of body member 22 is less than the thickness of end portions 54 and 55 of heat sink member 50. Thus, when screw 38 is threaded into rivet 28 and tightened, body member 22 is forced downwardly against end portions 54 and 55 to lock them between the body member and the board. Also, the depth of each of the channel portions 43*a* and 43*b* gradually increase in a direction from the adjoining end surface toward the channel end. The maximum depth of each channel portion 43*a* and 43*b* thus occurs at the channel end. There are two reasons for this feature. First, when heat sink member 50 is inserted over body member 22, end portions 54 and 55 can be over-bended into the deeper channel portions. Since the metal has a tendency to spring back to some degree after bending it into the desired shape, it can be over-bended so that it will return to the desired configuration in which end portons 54 and 55 lie at right angles to lower vertical leg portions 52*c* and 53*c*. The second reason for this feature is that when body member 22 is tightened down against terminal board 10, the greatest pressure against end portions 54 and 55 will occur just at the points where they enter beneath the bottom surface of body member 22. As shown on the drawings, the entire under surface of end portions 54 and 55 should lie directly in contact with terminal board 10** to insure greatest heat transfer.

Since the depth of channel portions **43*a* and 43*b* is less than the thickness of end portions 54 and 55, heat sink member 50 can be tightly locked between body member 22 and terminal board 10 by simply tightening screw 38 into hollow rivet 28. To further prevent any relative motion between heat sink member 50 and body member 22, the lower vertical leg portions 52*c* and 53*c* tightly engage the opposite end surfaces of channel 43, and the middle leg portions 52*b* and 53*b* tightly engage surfaces 45 and 46. These features of the heat sink member 50 and the channel 43 also act to prevent movement of heat sink member 50 within the channel prior to the time the body member is secured to the board 10. In effect, heat sink member 50 is rigidly secured to body member 22 within channel 43 prior to the time that they are secured to terminal board 10. The attachment of body member 22 to board 10 acts to further lock heat sink member 50 within channel 43**.

Since the flat upper portion 51 of heat sink member 50 lies in direct contact with the integrated circuit member 21, it absorbs much of the heat generated by the integrated circuit during its operation. Heat sink member 50 carries the heat downwardly toward terminal board 10. Some of the heat carried by heat sink member 50 is dissipated to the atmosphere but a major portion of the heat is carried to the terminal board 10 and is absorbed by the terminal board because of the intimate contact between end portions 54 and 55, and terminal board 10. Therefore, the present invention provides a new and unique apparatus for use in conjunction with a connector assembly to carry away and dissipate the heat being generated by an integrated circuit.

What is claimed is:

1. Integrated circuit mounting apparatus, comprising:

(a) a metal terminal board having a plurality of passages formed therethrough in a predetermined pattern;

(b) an integrated circuit member having a like plurality of connector pins extending therefrom in said predetermined pattern;

(c) a connector assembly for connecting said integrated circuit member to said terminal board including:

(1) a connector body member, having top and bottom surfaces and opposite end surfaces, constructed from an insulating material and having a like plurality of openings formed between said top and bottom surfaces in said predetermined pattern; and (2) a wire wrap pin mounted in each of said openings and extending from said bottom surface, said wire wrap pins each having a spring clip end portion positioned within said body member;

(d) means for securely attaching said connector assembly to said terminal board with said wire wrap pins extending through said passages, said integrated circuit member being mounted on said top surface with said connector pins extending into said openings for engagement with said corresponding spring clip end portions; and (e) a metal heat sink member having a flat upper portion and a pair of side portions diverging therefrom and terminating in a pair of end portions, said flat upper portion being positioned between said integrated circuit member and said connector body member in surface contact with said integrated circuit member, said side portions extending around said opposite end surfaces of said body member, and said end portions being positioned against said metal terminal board whereby said heat sink member absorbs heat from said integrated circuit member and transfers said heat to the atmosphere and to said metal terminal board.

2. The apparatus of claim 1 wherein said connector pins and wire wrap pins are located in a pair of spaced rows, wherein said connector body member has a channel formed between said rows, wherein said heat sink member is mounted in said channel, and wherein said end portions are curved inwardly and locked between said connector body member and said metal terminal board.

3. The apparatus of claim 1 wherein said openings in said body member lie in a pair of spaced rows, said rows extending between said opposite end surfaces, wherein a continuous channel is formed in said top surface and in said end surfaces between said rows, said continuous channel also having channel portions extending into said bottom surface a predetermined distance from each end surface and terminating in a pair of channel ends, and wherein said heat sink member is mounted in said channel with said upper portion protruding above said top surface of said connector body member for contact with said integrated circuit member, said side portions lying within the confines of said channel formed in said top and end surfaces, and said end portions extending into said corresponding channel portions in said bottom surface.

4. The apparatus of claim 3 wherein the depth of said channel portions in said bottom surface is less than the thickness of said end portions of said heat sink member so that when said body member is attached to said terminal board, said end portions will be locked between them.

5. The apparatus of claim 3 wherein the minimum depth of said channel portions in said bottom surface is less than the thickness of said end portions of said heat sink member, and wherein the depth of each of said channel portions gradually increases in a direction from said adjoining end surfarce toward said other end surface, to a maximum depth at said channel ends, so that said heat sink member end portions can be over-bended during installation thereof.

6. The apparatus of claim 3 wherein said flat upper portion and said pair of end portions of said heat sink member lie in generally parallel, horizontal planes, and wherein each of said side portions comprise an upper vertical leg portion, a lower vertical leg portion, and a middle horizontal leg portion, said middle leg portions tightly engaging the top surface of said body member within said channel, and said heat sink member end portions tightly engaging said bottom surface of said body member within said channel portions to rigidly secure said heat sink member to said body member.

7. In an assembly for connecting an integrated circuit member to a terminal board having a plurality of passages formed therethrough in a predetermined pattern, said assembly including a connector body member having pins extending from a bottom surface thereof and means for securing said body member to said board with said pins extending through said passages, said body member further having receptacle means in a top surface thereof for engaging the connector pins of an integrated circuit member to provide electrical contact with said pins in said body member, the improvement comprising a heat sink member having an upper portion mounted for contact with said integrated circuit member, side portions extending around said body member towards said terminal board, and end portions positioned for contact with said terminal board.

8. The apparatus of claim 7 wherein said heat sink member is a metal member having a flat upper portion, a pair of side portions diverging therefrom and a pair of end portions, said flat upper portion being mounted above the surface of said body member for contact with said integrated circuit member, said side portions extending around said body member towards said terminal board, and said end portions being positioned for locking between a terminal board and said bottom surface of said body member, said heat sink member thereby acting to dissipate heat from said integrated circuit member to the atmosphere and to the terminal board.

9. The apparatus of claim 7 wherein said improvement further comprises a channel formed in said top surface and a pair of opposite end surfaces of said body member, said channel also having channel portions extending into said bottom surface a predetermined distance from each end surface and terminating in a pair of channel ends, and wherein said heat sink member is mounted in said channel with said upper portion protruding above said top surface of said connector body member for contact with said integrated circuit member, said side portions lying within the confines of said channel formed in said top and end surfaces, and said end portions extending into said corresponding channel portions in said bottom surface.

10. The apparatus of claim 9 wherein the depth of said channel portions in said bottom surface is less than the thickness of said end portions of said heat sink member.

11. The apparatus of claim 10 wherein the depth of each of said channel portions gradually increases to a maximum depth at said channel ends, so that said heat sink member end portions can be over-bended during installation thereof.

References Cited

UNITED STATES PATENTS 3,261,904 7/1966 Wulc ---------------- 174—15

LEWIS H. MYERS, Primary Examiner
GERALD P. TOLIN, Assistant Examiner

U.S. Cl. X.R.

174—15